United States Patent

[11] 3,631,462

[72] Inventor Herbert Dym
Mahopac, N.Y.
[21] Appl. No. 33,323
[22] Filed Apr. 30, 1970
[45] Patented Dec. 28, 1971
[73] Assignee International Business Machines Corporation
Armonk, N.Y.

[54] MULTIPURPOSE GRAPHIC INPUT PULSE TRANSDUCING CIRCUIT
6 Claims, 4 Drawing Figs.

[52] U.S. Cl. .......... 340/347 CC, 332/9
[51] Int. Cl. .......... H03k 13/02
[50] Field of Search .......... 340/347 AD, 347 CC, 347 NT; 332/9; 328/127, 128; 324/99

[56] References Cited

UNITED STATES PATENTS

| | | | |
|---|---|---|---|
| 3,390,354 | 6/1968 | Munch | 340/347 NT |
| 3,322,942 | 5/1967 | Gerard | 340/347 NT |
| 2,897,486 | 7/1959 | Alexander | 340/347 CC |
| 3,430,149 | 2/1969 | Williams | 328/127 |

*Primary Examiner*—Thomas A. Robinson
*Assistant Examiner*—Jeremiah Glassman
*Attorneys*—Hanifin and Jancin and Victor Siber

ABSTRACT: A multipurpose circuit to be used in a graphic data tablet for providing the functions of pulse width modulation filtering, pulse width demodulation, selectable bandwidth for sensitivity, translation of coordinate system, and peak track-and-hold capability. The multipurpose circuit receives as its input a pulse width modulated signal that represents positional information from a graphic tablet input device. A voltage-controlled single shot is utilized to transduce the input signal into a desired wave pattern to achieve any of the above-mentioned functions. Comparator means are provided for comparing the input signal stream to previously processed pulses and generate either a positive or negative error signal. These error signals are then integrated to provide a feedback voltage that controls the duration of the single shot.

Patented Dec. 28, 1971 3,631,462

INVENTOR
HERBERT DYM

BY Victor Siber
AGENT

MULTIPURPOSE GRAPHIC INPUT PULSE TRANSDUCING CIRCUIT

RELATED PATENT APPLICATIONS

This application references application Ser. No. 772,295, filed Oct. 31, 1968, now pending, entitled "Hand Entry Position Measuring System, " assigned to the same assignee as the present application.

BACKGROUND OF THE INVENTION

This invention relates to a multipurpose signal-transducing circuit. More particularly, it relates to a multipurpose circuit to be used in processing pulse width modulated signals that relate to positional information.

A number of techniques have been developed for translating graphic representations into digital signals for computer system input. One of these techniques is the conversion of an analog voltage sensed by means of a capacitively coupled pen into a pulse width modulated signal whose time duration controls the operation of a counter. The counter begins to run at the leading edge of the pulse width modulated signal and is shut off on the trailing edge of the pulse. The remaining count then represents a digital value which is indicative of the position at which the analog voltage was sensed. This translation technique is incorporated in U.S. Pat. application, Ser. No. 772,295.

Said copending patent application discloses an analog graphic input tablet of the capacitively coupled stylus type. The graphic tablet provides conversion of the analog graphic positional signal by means of a dual ramp type of A/D converter. The dual ramp circuit generates a pulse for each conversion cycle. This pulse is used to gate a series of clock pulses to a digital counter. Thus, the effective width of the generated pulse determines the running time of the counter by determining the number of clock pulses that are allowed to increment the counter. It has been found in the operation of these types of converter circuits that there is a certain amount of noise inherent in the conversion process.

Furthermore, analog graphic input tablets require a need for amplification of the input signal sensed by the capacitively coupled stylus. This needed amplification is usually provided by a band-pass amplifier circuit. While the needed gain in signal is achieved, there is also a tendency to introduce a certain amount of noise in the analog signal. By reference to said copending application, it is seen that this noise is introduced in both the positional and reference input lines. In the prior art systems, noise elimination was achieved by filtering each of the input lines to the A/D converter. This approach presents problems in terms of component matching so as to achieve the same filtering function on each input.

In the design of graphic data entry tablets, it is generally desirable to provide as many features for operator control of the input data. This versatility is needed in order to reduce the amount of software control in the system. One feature which is useful in graphic design is the ability to translate a coordinate system. Usually, translation capability is achieved by either programming control of the information or by means of additional digital registers, both of which require substantial additional costs in the manufacture of the tablet.

Another feature which is desirable in graphic entry tablets is the ability to sometimes record when the operator exceeds a particular value. Usually, this is achieved by means of having a special circuit to detect a particular value and create a check signal when the input exceeds some previous graphic position.

In the operation of a graphic data tablet, it has been found that tracking errors are sometimes created upon the beginning of a graphic entry. This is caused by the fact that the operator must bring the stylus into contact with the tablet surface from some point above the surface. As the operator approaches the vicinity of the field of influence of the stylus, signals with tracking errors are detected, sampled and processed. This positional information is generally in the vicinity of the desired point of contact, but should be ignored.

Another feature which is desirable in a graphic entry system, is means for displaying an image relative to the stylus position on the tablet surface. In order to provide this visual information, it is necessary to demodulate the digital information and provide some feedback signal to a display means.

It is therefore an object of the present invention to provide a multipurpose circuit for a graphic data entry tablet that achieves the functions of pulse width filtering, pulse width demodulation, variable bandwidth for the minimization of tracking errors, translation of coordinates, and maximum signal detection.

It is a further object of the present invention to provide a pulse width noise elimination circuit that is independent of component drift.

It is a further object of the present invention to provide a single noise elimination circuit for a graphic data tablet that processes positional information after analog to digital conversion.

It is a further object of the present invention to eliminate jitter noise from a pulse with modulated signal stream by means of a voltage-controlled single shot.

SUMMARY OF THE INVENTION

In the present invention, a multipurpose circuit for filtering pulse width modulation noise, demodulation of a pulse width signal, variable control of the bandwidth of a graphic tablet, translation of coordinates system, and maximum value detection is provided.

The multipurpose circuit processes a pulse width modulation signal through a voltage-controlled single shot. The voltage control in the circuit determines the duration of the pulses generated by the single shot output is made to follow the previous pulses in terms of duration by means of a feedback control voltage. This provides a closed loop operation which is independent of component drift. The single shot output is used to create two error pulses. The first one detects positive errors and the second one detects negative errors. Both of these error functions are introduced into an integrator circuit for developing an analog output voltage. It is this analog potential that is used to control the duration of a single shot. Thus, by properly adjusting the relationship between analog voltage and duration of pulses, the output of the single shot represents a filtered pulse width modulation pulse which has reduced jitter noise.

This multipurpose circuit also provides variable bandwidth by controlling the gain of the feedback voltage thus changing the duration of the pulses relative to the control voltage. A variable bandwidth may also be achieved by changing the time constant of the integrator.

Two control lines are connected to each of the error detectors. In the filtering mode, both control lines are gated "on" to allow either positive or negative errors to be introduced to the integrator. In order to operate the circuit to detect maximum displacement on the tablet, either one of the control gate lines is degated.

Furthermore, a variable input voltage is introduced to one of the inputs to the integrator for the purpose of translating the coordinate system on the tablet. A variable resistance to a voltage supply effectively introduces a control drift to the integrator so that the analog output of the integrator will drive the single shot to increment all pulses by a fixed amount.

The foregoing and other objects, features and advantages of the invention will be apparent from the following more particular description of a preferred embodiment of the invention, as illustrated in the accompanying drawings.

DETAILED DESCRIPTION OF THE INVENTION

Figure 1:
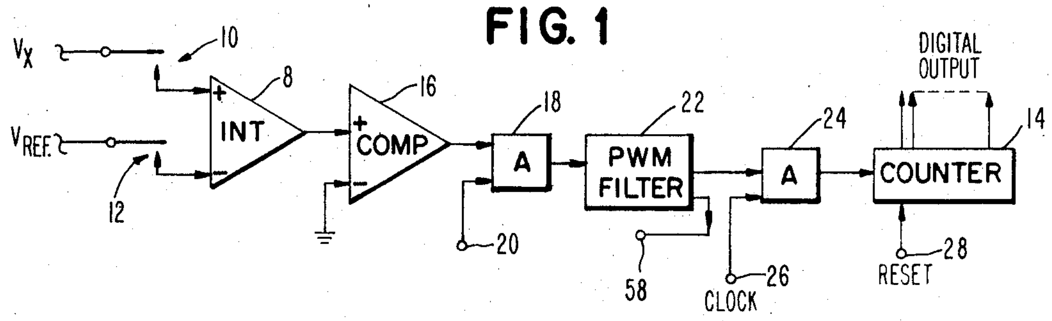
FIG. 1 represents a block diagram of a dual ramp converter circuit in conjunction with the multipurpose circuit.

Referring to FIG. 1, there is shown a block diagram of a dual ramp converter such as disclosed in U.S. Pat. Application, Ser. No. 772,295. This type of device converts an unknown analog signal to a digital signal by means of an integration and counting process. The unknown voltage level is shown as $V_x$. This potential is introduced into the integrator 8 by closing switch 10, thus causing the output of the integrator 8 to begin a ramp function as shown in the timing diagram in FIG. 2. This unknown voltage is integrated for a fixed period of time T. It is at this point that the integrator 8 is allowed to integrate a reference signal introduced via line 12 down until a zero value is reached. This is shown as a ramp function towards a zero level in FIG. 2.

Figure 2:
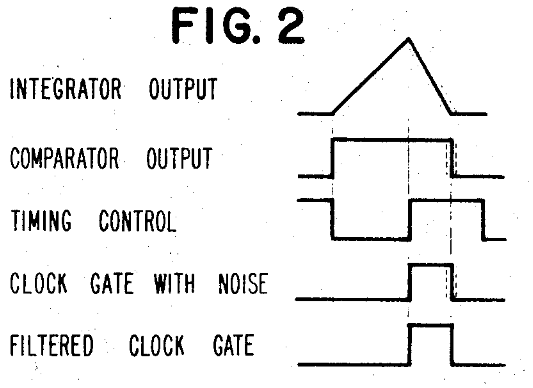
FIG. 2 shows electrical pulse signals at various points in the block diagram of FIG. 1.

In the normal operation of a graphic input tablet, it is found that noise is sometimes introduced into the system by the sense amplifier that appears after the capacitively coupled stylus. This sort of noise generates jitter in the bandwidth range at which the sampling occurs. This noise variation is shown as a dotted line in the downward ramp function at the output of the integrator 8, as shown in FIG. 2.

At the time that the reference voltage was introduced to the integrator at time T, a counter 14 begins to count under the control of a clock 26 until a time *t* is reached at which point the integrator 8 output crosses a zero value. The counter runs for the duration of a pulse that is generated by the comparator 16 which drives AND-gate 18 under the timing control input 20. The pulse which appears at the output of the AND-gate 18 referenced as, clock gate with noise, in FIG. 2, indicates that there may be some variation in the falling edge of the control pulse to the counter. Thus, a multipurpose circuit 22 effectively filters the output of the AND-gate 18 to reduce pulse width noise conditions and introduces the filtered PWM signal via AND-gate 24 which operates under the control of clock 26 to counter 14. After the counter 14 is shut off at some later time, the timing control returns to zero. Then, the counter value is reset by means of line 28.

Figure 3:
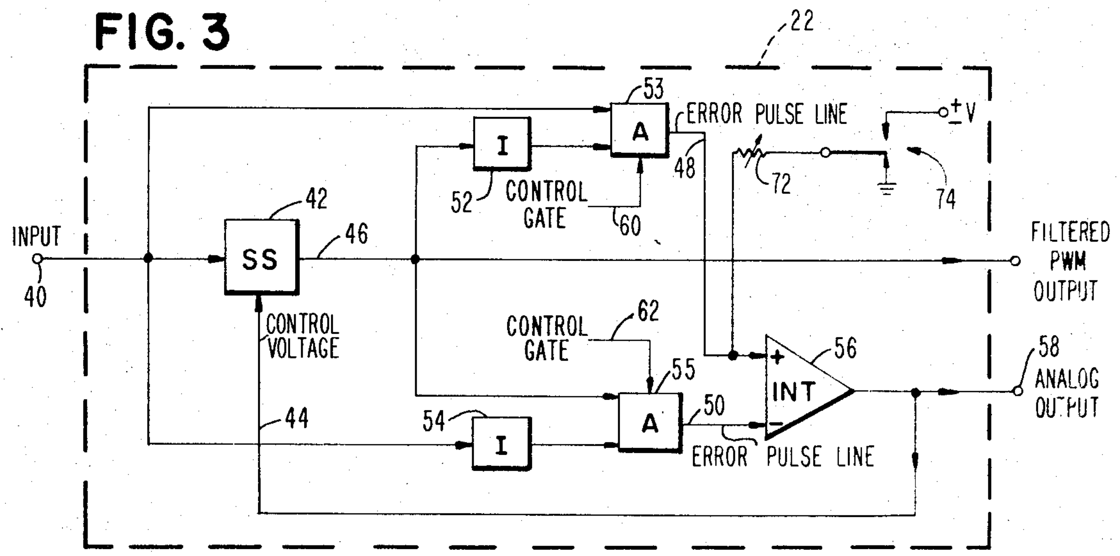
FIG. 3 represents a circuit diagram of the multipurpose circuit.

Referring now to FIG. 3, there is shown a multipurpose circuit 22. Input line 40 introduces a pulse width modulated signal representative of stylus position into a voltage control single shot 42. The leading edge of the input signal triggers the single shot 42 so that an output pulse begins approximately at the same time as the leading edge of the input signal. The duration of the single shot is controlled by the voltage value present on control voltage line 44. Thus, depending on the amplitude of the voltage feedback along line 44, the duration of the pulses of the single shot will either be widened or narrowed. The output of single shot 42, shown as line 46, is utilized to create two error pulse lines 48 and 50. Line 46, which carries a filtered PWM signal from the single shot 42, is inverted by means of inverter 52. Then, the inverted signal is ANDed with the input PWM signal stream by AND-gates 53 and an noninverted filtered PWM signal is ANDed with an inverted input PWM signal by means of AND-gate 55. This in effect creates narrow error pulses transmitted on either line 48 or 50.

The error pulse lines 48 and 50 transmit a narrow pulse which represents the difference between the output of the single shot and the input PWM signal. Thus, if the output of the single shot is greater in width than the input signal, an error pulse signal will be transmitted along line 50 to the integrator 56. In the same manner, if the output of the single shot is narrower than the input pulse, an error pulse signal will be introduced to the integrator along line 50 indicating the difference. The integrator 56 then converts the error pulse signals to an analog voltage which is utilized as the feedback control potential for the voltage-controlled single shot 42. This feedback control voltage reduces the difference between the input PWM signal and the output of the single shot.

The integrator 56 has a dual function in that besides providing the voltage control feedback signal along line 44, it also provides demodualtion of the PWM input signal at terminal 58. The voltage appearing at terminal 58 is directly proportional to graphic input position. Thus, this analog demodulation signal may be used to drive a display screen to represent to an operator a visual signal indicating position of stylus on the tablet surface.

In the normal operation of the multipurpose circuit, control gate lines 60 and 62 present an ON gate signal to the AND-gates 53 and 55 to develop the proper error pulse signals. When it is desired to operate the multipurpose circuit in a maximum signal tracking detection mode, one of the control gates lines degates either AND-gate 53 or 55 to an OFF condition. Thus, the integrator 56 will only sense one type of input. This allows the single shot to follow in only one direction, a positive increment if AND-gate 53 in ON, or a negative increment if AND-gate 55 is ON. Functionally, this creates the ability to use the circuit as a peak track-and-hold circuit. Both the filtered PWM output along line 46 and the analog output along line 58 will not change unless a particular value is exceeded.

The multipurpose circuit of FIG. 3 may also be used in a coordinate translation mode. Variable resistance 72 is shown as having a junction input to line 48. In the filtering mode of the multipurpose circuit, switch 74 would be connected to ground, thus having no effect on the integrator 56 input. However, when it is desired to translate the coordinates of the graphic data tablet, switch 74 is changed to either a plus or minus voltage V which will introduce a controlled drift to the integrator 56. This has the effect of always creating a differential between the input and the output. It is this differential in pulse width that effectively creates a translation of the coordinate system. Every pulse width representative of an X- or Y-position is modified a discrete amount in their respective durations thus effectively shifting the coordinate points of the tablet.

As indicated above, the voltage-controlled single shot 42 is adjusted to create a pulse width relative to the analog feedback voltage along line 44. By controlling the relationship of the single shot 42 output width relative to the control voltage, it is possible to vary the bandwidth of the multipurpose circuit. For example, when the feedback voltage provides a gain of 1 that is, a perfect correction of the input to follow the output pulse, the multipurpose circuit is said to operate at a first bandwidth. This unity gain is achieved by adjusting the time constant of the integrator so that a given error in width causes a voltage change that will exactly modify the single-shot duration by an amount equal to the error. Under this condition the circuit operates in a pulse follower mode. This causes the multipurpose circuit to provide an output PWM signal that exactly tracks the input signal except for a delay of 1 pulse cycle.

To adjust the feedback gain in the loop to less than unity, the time constant of the integrator is increased thus reducing the bandwidth of the multipurpose circuit. This mode is referred to as the nonelevation position mode. When the operator holds the pen above the surface of the tablet, it is desired to increase the bandwidth of the multipurpose circuit. This will eliminate tracking error position indications detected prior to when the stylus is brought in contact with the surface of the tablet.

When the pen is actually brought into contact with the faceplate of the tablet or a writing medium on said faceplate, the bandwidth of the multipurpose circuit is switched to a low condition by varying the integrator time constant to create a gain less than unity. Thus, the circuit tends to operate as a pulse follower in this mode.

Figure 4:
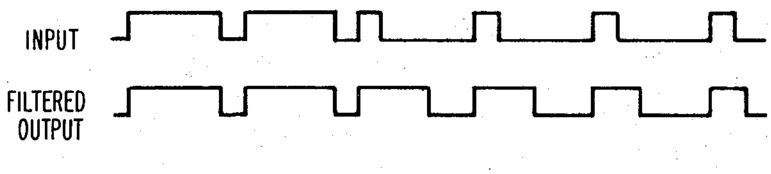
FIG. 4 is a timing diagram comparing the input signals and the filtered output signals of the multipurpose circuit of FIG. 3.

Referring now to FIG. 4, there is shown a timing diagram of the unfiltered PWM input signal and the filtered output provided by the multipurpose circuit of FIG. 3 along line 46. As indicated in the input signal, the third pulse shows a significant change in width. This is effectively a high-frequency change. The multipurpose circuit of FIG. 3, in its filtering mode, provides an output signal which filters out this high-frequency change. Thus, the third signal pulse on the filtered output tends to follow the width of the second pulse of the filtered output. The following pulses shown in the filtered output signal tend to decrease in width so as to approach the input at some later time. Thus, this slow variation of the width of the pulses is an effective filtering of fast-frequency increments in PWM input signals which are considered to be error signals.

While the invention has been described with respect to a preferred embodiment of a capacitively coupled graphic data tablet, it should be recognized by those skilled in the art that it is not limited to such use. The inventive multipurpose circuit may be utilized in any environment where the resultant functions discussed above are desired. For example, in its filter mode, the circuit may be incorporated into a digital voltmeter that converts an unknown potential into a digital signal by means of a pulse width modulated signal. Furthermore, this circuit may be utilized as a pulse width demodulator in a communication system. These examples are merely illustrative and are not to be considered limiting with respect to alternative uses of this invention.

What is claimed is:

1. In a system for converting an unknown analog voltage to a digital electronic signal, wherein said system contains an integrator means, zero detection means, and digital counter means that operates under the control of a clock, the improvement comprising a multipurpose circuit for transducing a pulse width modulated signal derived from said zero detection means, said multipurpose circuit including:

a voltage-controlled pulse width generator means having a first input, a second input and an output;

said first input connected to a pulse width modulated signal supply means;

said output providing a stream of pulses corresponding to said signal supply means;

said output connected to a first error pulse detection means and a second error pulse detection means;

said first input further connected to said first and second error pulse detection means;

said first error pulse detection means and said second error pulse detection means having output terminals connected to integrator means having an integrator output;

said integrator output connected to said second input of said pulse width generator means;

whereby said integrator output provides a control voltage to said voltage-controlled pulse width generator means for filtering out high-frequency changes in said pulse width modulated signal supply.

2. The system as defined in claim 1 further comprising gate control means connected to said first and second error pulse detection means and operable selectively for inhibiting one of said first and second error pulse detection means.

3. A system as defined in claim 2 further comprising variable impedance means and means for connecting one said input of said integrator means through said variable impedance to a voltage source to effect a controlled drift of said integrator means output.

4. A pulse- transducing circuit comprising:

a voltage-controlled single shot having a first and second input terminal and an output terminal;

said input terminal introducing a pulse width modulated signal stream to said single shot;

first error-generating means for creating a differential pulse representing the difference between the output of said single shot and the input of said single shot;

second error pulse generating means for creating a differential pulse representing the difference between the output of said single shot and the input of said single shot;

integrator means connected to said first and second error pulse generating means for providing an analog signal at an output terminal;

feedback means connecting said integrator output terminal and said voltage-controlled single shot second input terminal for providing an analog signal which is proportional to said differential pulse to control the duration of said single shot.

5. The circuit as defined in claim 4 further comprising:

gate control means operable selectively for inhibiting one of said first and second error pulse generating means so as to operate said circuit in a maximum position detection mode.

6. A circuit as defined in claim 5 further comprising variable impedance means and means for connecting one said input of said integrator means through said variable impedance to a voltage source to effect a controlled drift of said integrator means output.

* * * * *